United States Patent
Ohguro et al.

(10) Patent No.: US 10,998,437 B2
(45) Date of Patent: May 4, 2021

(54) SEMICONDUCTOR DEVICE

(71) Applicants: Kabushiki Kaisha Toshiba, Minato-ku (JP); Toshiba Electronic Devices & Storage Corporation, Minato-ku (JP)

(72) Inventors: Tatsuya Ohguro, Nonoichi (JP); Tatsuya Nishiwaki, Nonoichi (JP); Hideharu Kojima, Kanazawa (JP); Yoshiharu Takada, Nonoichi (JP); Kikuo Aida, Oita (JP); Kentaro Ichinoseki, Nonoichi (JP); Kohei Oasa, Nonoichi (JP); Shingo Sato, Kanazawa (JP)

(73) Assignees: Kabushiki Kaisha Toshiba, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 0 days.

(21) Appl. No.: 16/531,642

(22) Filed: Aug. 5, 2019

(65) Prior Publication Data

US 2020/0152785 A1 May 14, 2020

(30) Foreign Application Priority Data

Nov. 12, 2018 (JP) .............................. JP2018-211902

(51) Int. Cl.
*H01L 29/78* (2006.01)
*H01L 29/417* (2006.01)
(Continued)

(52) U.S. Cl.
CPC .... *H01L 29/7811* (2013.01); *H01L 23/53238* (2013.01); *H01L 23/53271* (2013.01);
(Continued)

(58) Field of Classification Search
None
See application file for complete search history.

(56) References Cited

U.S. PATENT DOCUMENTS

2002/0011664 A1   1/2002  Tanaka
2016/0190141 A1*  6/2016  Lee ..................... H01L 29/7851
                                                                257/390
(Continued)

FOREIGN PATENT DOCUMENTS

JP    2000-68313 A    3/2000
JP    3087158 B2      7/2000
(Continued)

OTHER PUBLICATIONS

G. Schindler et al., "Impact of Alpha-Radiation on Power MOSFETs", IRPS, IEEE, 2016, 5 pages.

*Primary Examiner* — Dung A. Le
(74) *Attorney, Agent, or Firm* — Oblon, McClelland, Maier & Neustadt, L.L.P.

(57) ABSTRACT

A semiconductor device according to an embodiment includes a semiconductor substrate having a first plane and a second plane, a semiconductor element provided in the semiconductor substrate, the semiconductor element including a gate insulating film provided in the first plane, a first electrode provided on the first plane, a second electrode provided on the first electrode, the second electrode including a first metal material, the second electrode having a film thickness of (65 [g·μm·cm$^{-3}$])/(density of the first metal material [g·cm$^{-3}$]) or more, a first solder portion provided on the second electrode, a third electrode provided on the first solder portion, a fourth electrode provided on the first plane, a fifth electrode provided on the fourth electrode, the fifth electrode including a second metal material, the fifth electrode having a film thickness of (65 [g·μm·cm$^{-3}$])/(density of the second metal material [g·cm$^{-3}$]) or more, a second solder portion provided on the fifth electrode, and a sixth electrode provided on the second solder portion.

18 Claims, 11 Drawing Sheets

(51) Int. Cl.
*H01L 23/00* (2006.01)
*H01L 23/532* (2006.01)
(52) U.S. Cl.
CPC ........ *H01L 24/13* (2013.01); *H01L 29/41741* (2013.01); *H01L 29/7813* (2013.01); *H01L 2224/13147* (2013.01)

(56) References Cited

U.S. PATENT DOCUMENTS

2019/0057873 A1    2/2019   Sugahara et al.
2020/0235003 A1*   7/2020   Hyun .................. H01L 27/1157

FOREIGN PATENT DOCUMENTS

| JP | 2002-43352 A | 2/2002 |
| JP | 6253854 B1 | 12/2017 |
| WO | WO 2017/169086 A1 | 10/2017 |

\* cited by examiner

SEMICONDUCTOR DEVICE

CROSS-REFERENCE TO RELATED APPLICATION

This application is based upon and claims the benefit of priority from Japanese Patent Application No. 2018-211902, filed on Nov. 12, 2018, the entire contents of which are incorporated herein by reference.

FIELD

Embodiments described herein relate generally to a semiconductor device.

BACKGROUND

Power semiconductor devices designed for power control has been developed which are represented by semiconductor elements such as a metal oxide semiconductor field effect transistor (MOSFET) and an insulated gate bipolar transistor (IGBT) used in a wide range of fields such as power generation and power transmission, rotating machines such as pumps and blowers, power supplies for communication systems and factories, railways with AC motors, electric vehicles, and home electric appliances.

For example, a semiconductor device which drives a motor or the like using a vertical MOSFET includes the vertical MOSFET in a semiconductor substrate. The source electrode and the gate electrode of the vertical MOSFET are connected to electrodes containing Cu (copper) or the like provided on the semiconductor substrate by solder or the like. The drain electrode of the vertical MOSFET is connected to an electrode containing Cu or the like provided under the semiconductor substrate by solder or the like. The electrodes containing the above-described Cu or the like is connected to an external electric circuit or the like.

When α rays generated from solder penetrate the gate insulating film of the semiconductor element, electron-positive hole pairs are generated in the gate insulating film due to the energy possessed by a rays. When a bias voltage is applied to the gate electrode, the generated electrons move to the semiconductor substrate or the gate electrode. However, positive holes remain in the gate insulating film. This is because the mobility of positive holes is lower than the mobility of electrons. There is a problem that the threshold voltage Vth of the MOSFET changes to a more negative side due to the remaining positive holes.

DETAILED DESCRIPTION

Figure 1:
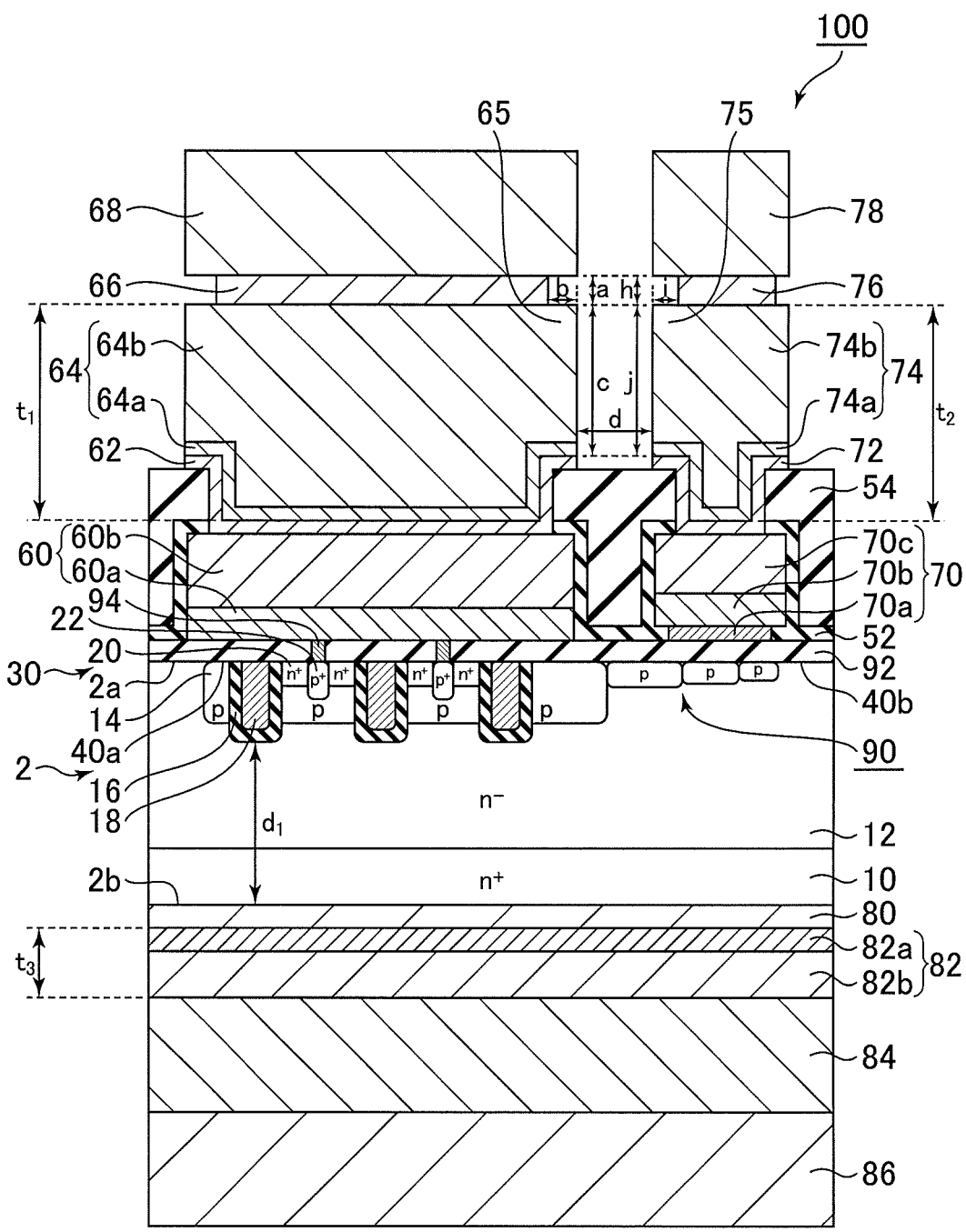
FIG. 1 is a schematic cross-sectional view of a semiconductor device of a first embodiment.

Hereinafter, embodiments will be described using the drawings. In the drawings, the same or similar parts are denoted by the same or similar reference numerals.

In the present specification, the same or similar members will be denoted by the same reference symbols, and overlapping descriptions may be omitted.

In the present specification, the upper direction of the drawing is described as "upper" and the lower direction of the drawing as "lower" or "under" in order to indicate the positional relationship of parts and the like. In the present specification, the terms "upper", "lower" and "under" are not necessarily terms indicating the relationship with the direction of gravity.

In the present specification, the expressions $n^+$, $n$, $n^-$ and $p^+$, $p$, $p^-$ indicate the relative height of the impurity concentration in respective conductivity types. That is, $n^+$ indicates that $n^+$ is relatively higher than n in the impurity concentration of n-type, and $n^-$ indicates that $n^-$ is relatively lower than n in the impurity concentration of n-type. Further, $p^+$ indicates that $p^+$ is relatively higher than p in the impurity concentration of p-type, and $p^-$ indicates that $p^-$ is relatively lower than p in the impurity concentration of p-type. In some cases, $n^+$ and n– may be simply described as n-type, and $p^+$ and p– may be simply described as p-type.

First Embodiment

A semiconductor device according to an embodiment includes a semiconductor substrate having a first plane and a second plane, a semiconductor element provided in the semiconductor substrate, the semiconductor element including a gate insulating film provided in the first plane, a first electrode provided on the first plane, a second electrode provided on the first electrode, the second electrode including a first metal material, the second electrode having a film thickness of (65 [g·μm·cm$^{-3}$])/(density of the first metal material [g·cm$^{-3}$]) or more, a first solder portion provided on the second electrode, a third electrode provided on the first solder portion, a fourth electrode provided on the first plane, a fifth electrode provided on the fourth electrode, the fifth electrode including a second metal material, the fifth electrode having a film thickness of (65 [g·μm·cm$^{-3}$])/(density of the second metal material [g·cm$^{-3}$]) or more, a second solder portion provided on the fifth electrode, and a sixth electrode provided on the second solder portion.

FIG. 1 is a schematic cross-sectional view of a semiconductor device 100 according to the present embodiment. The semiconductor device 100 of the present embodiment includes a trench MOSFET 30.

A semiconductor substrate 2 is, for example, an Si (silicon) substrate.

The MOSFET 30 is an example of a semiconductor element. The MOSFET 30 includes a semiconductor layer 10, a drift layer 12, a well region 14, a gate insulating film 16, a gate electrode 18, a source region 20, and a contact region 22.

A first plane 2a is provided on the upper side of the semiconductor substrate 2. A second plane 2b is provided on the lower side of the semiconductor substrate 2. The n⁻-type drift layer 12 is provided on the n⁺-type semiconductor layer 10. In other words, the drift layer 12 of the semiconductor substrate 2 has the first plane 2a, and the semiconductor layer 10 of the semiconductor substrate 2 has the second plane 2b.

The first plane 2a includes a first region 40a and a second region 40b. The MOSFET 30 is provided in and under the first region 40a.

The p-type well region 14 is provided inside the drift layer 12 and a portion of the p-type well region 14 is provided in contact with the first region 40a.

The upper portion of the gate electrode 18 is provided with, for example, its upper portion in contact with the first region 40a. The gate electrode 18 extends from the first region 40a toward the second plane 2b, and its lower portion penetrates the well region 14 and is provided in the drift layer 12. The gate electrode 18 includes, for example, polycrystalline polysilicon containing an impurity. In the semiconductor device 100 shown in FIG. 1, the number of gate electrodes 18 shown is three. However, naturally, the number of gate electrodes 18 is not specific to this.

The p⁺-type contact region 22 is provided between the respective gate electrodes 18 so that a portion of the p⁺-type contact region 22 is in contact with the first region 40a.

The n⁺-type source region 20 is provided between the gate electrode 18 and the contact region 22.

The gate insulating film 16 is provided in contact with the first region 40a. Further, the gate insulating film 16 is provided in the first region 40a. The gate insulating film 16 is provided between the well region 14 and the gate electrode 18, between the drift layer 12 and the gate electrode 18, and between the source region 20 and the gate electrode 18. The gate insulating film 16 extends from the first plane 2a to the second plane 2b of the semiconductor substrate 2. The gate insulating film 16 contains, for example, silicon oxide.

A termination structure 90 is provided in and under the second region 40b. The termination structure 90 is a structure with which the concentration of an electric field at the end of the semiconductor device 100 is reduced wherein the concentration occurs when the reverse bias is applied to the MOSFET 30. The termination structure 90 shown in FIG. 1 is a junction terminal extension (JTE) structure in which a plurality of p-type regions is provided along the first plane 2a in the drift layer 12.

The structure of the termination structure 90 is not specific to this, and a known guard ring structure, a known RESURF structure, a known variation lateral doping (VLD) structure, or the like can be preferably used.

An insulation film 92 is provided on the first plane 2a. The insulation film 92 contains, for example, silicon oxide.

A contact 94 is provided inside an hole penetrating the insulation film 92 provided on the contact region 22. The contact 94 is, for example, a TiN (titanium nitride) film or a stacked film of Ti (titanium) and TiN. However, naturally, the material used for the contact 94 is not specific to this.

A first electrode 60 is provided on the first region 40a. The first electrode 60 is provided, for example, on the insulation film 92 and connected to the contact 94. The first electrode 60 includes, for example, a first Ti-containing electrode 60a containing Ti (titanium) and a first Al-containing electrode 60b containing Al (aluminum), the first Al-containing electrode 60b being provided on the first Ti-containing electrode 60a. Thus, the first electrode 60 is electrically connected to the source region 20 of the MOSFET 30 through the contact 94 and the contact region 22. The first electrode 60 is made of a material containing Ti to maintain conductivity even when oxygen is absorbed by the first Ti-containing electrode 60a in direct contact with the contact 94. The first electrode 60 is configured such that the first Al-containing electrode 60b containing inexpensive Al is provided on the first Ti-containing electrode 60a. Naturally, the configuration of the first electrode 60 is not specific to this.

A second electrode 64 is provided on the first electrode 60 and includes a first metal material. The second electrode 64 includes a first base layer 64a and a first plating electrode 64b provided on the first base layer 64a. As described later, the formation of the second electrode 64 is performed by forming the first base layer 64a and then forming the first plating electrode 64b by plating. In other words, the first base layer 64a is a base layer used for plating. The configuration of the second electrode 64 is not specific to this.

The film thickness $t_1$ of the second electrode 64 is preferably (65 [g·μm·cm⁻³])/(density of the first metal material [g·cm⁻³]) or more. For example, when the second electrode 64 is formed of Cu (copper), it is preferable that the film thickness $t_1$ of the second electrode 64 be 7 μm or more, when it is calculated with the density of Cu as 8.92 [g·cm⁻³].

A first Ti-containing layer 62 including a barrier metal formed of, for example, Ti is provided between the first electrode 60 and the second electrode 64.

A first solder portion 66 is provided on the second electrode 64. The first solder portion 66 is a solder member that joins the second electrode 64 and a third electrode 68 to be described later.

The third electrode 68 is provided on the first solder portion 66. The third electrode 68 is, for example, a connector, made of Cu, that connects an external electric circuit and the MOSFET 30.

A fourth electrode 70 is provided on the second region 40b. The fourth electrode 70 includes a polysilicon electrode 70a, a second Ti-containing electrode 70b provided on the polysilicon electrode 70a, and a second Al-containing electrode 70c provided on the second Ti-containing electrode 70b. The polysilicon electrode 70a is connected to the gate electrode 18 via, for example, polysilicon wiring (not shown).

A fifth electrode 74 is provided on the fourth electrode 70 and includes a second metal material. The fifth electrode 74 includes a second base layer 74a and a second plating electrode 74b provided on the second base layer 74a. The second base layer 74a is a base layer used for plating for forming the second plating electrode 74b. The configuration of the second electrode 64 is not specific to this.

The film thickness $t_2$ of the fifth electrode 74 is preferably (65 [g·μm·cm⁻³])/(density of the second metal material [g·cm⁻³]) or more.

A second Ti-containing layer 72 including a barrier metal formed of, for example, Ti is provided between the fourth electrode 70 and the fifth electrode 74.

A second solder portion 76 is provided on the fifth electrode 74. The second solder portion 76 is a solder member joining the fifth electrode 74 and a sixth electrode 78 to be described later.

The sixth electrode 78 is provided on the second solder portion 76. The sixth electrode 78 is a connector, formed of, for example, Cu, that connects an external electric circuit and the MOSFET 30.

An insulation film 52 and an insulation film 54 are provided to insulate the first electrode 60 and the second electrode 64 from the fourth electrode 70 and the fifth electrode 74. The insulation film 52 is, for example, a silicon oxide film, and the insulation film 54 is, for example, a polyimide film.

It is preferable that the second electrode 64 include, between the second electrode 64 and the fifth electrode 74, an electrode portion (first electrode portion) 65 protruding in parallel to the first plane 2a relative to the first solder portion 66, and, further (a/b)<(a+c)/(b+d), where a is a film thickness of the first solder portion 66, b is a length of an upper face of the electrode portion 65 in the direction parallel to the first plane 2a, c is a film thickness of the electrode portion 65 in the direction perpendicular to the first plane 2a, and d is a distance between the electrode portion 65 and the fifth electrode 74 in the direction parallel to the first plane 2a.

It is preferable that the fifth electrode 74 include, between the second electrode 64 and the fifth electrode 74, an electrode portion (second electrode portion) 75 protruding in parallel to the first plane 2a relative to the second solder portion 76, wherein (h/i)<(h+j)/(i+d), where h is a film thickness of the second solder portion 76, i is a length of an upper face of the electrode portion 75 in a direction parallel to the first plane 2a, j is a film thickness of the electrode portion 75 in a direction perpendicular to the first plane 2a, and d is a distance between the electrode portion 75 and the second electrode 64 in a direction parallel to the first plane 2a.

An eighth electrode 82 includes a third metal material, and is connected to the second plane 2b via a barrier metal 80 formed of TiW or TiN (titanium nitride). The eighth electrode 82 is connected to the drain of the MOSFET 30. The eighth electrode 82 includes a third base layer 82a and a third plating electrode 82b provided under the third base layer 82a. The configuration of the eighth electrode 82 is not specific to this.

The film thickness $t_3$ of the eighth electrode 82 is preferably (65 [g·μm·cm$^{-3}$])/(density of the third metal material [g·cm$^{-3}$]) or more.

Each of the second electrode 64, the fifth electrode 74, and the eighth electrode 82 can be preferably used even if each of the second electrode 64, the fifth electrode 74, and the eighth electrode 82 includes a stacked structure of metal layers.

A third solder portion 84 is provided under the eighth electrode 82. The third solder portion 84 is a solder member joining the eighth electrode 82 and a seventh electrode 86 to be described later.

The seventh electrode 86 is provided under the third solder portion 84. In other words, the seventh electrode 86 is provided under the second plane 2b of the semiconductor substrate 2. The seventh electrode 86 is a connector, formed of, for example, Cu, that connects an external electric circuit and the MOSFET 30.

When the thickness of the semiconductor substrate 2 is 25 μm or less, it is particularly preferable that the eighth electrode 82 whose film thickness $t_3$ is (65 [g·μm·cm$^{-3}$])/(density of the third metal material [g·cm$^{-3}$]) or more be provided. More preferably, the distance $d_1$ between the second plane 2b and the gate insulating film 16 is 25 μm or less.

In other words, the semiconductor substrate 2 is provided between the third electrode 68 and the seventh electrode 86, and the sixth electrode 78 and the seventh electrode 86. The third solder portion 84 is provided between the seventh electrode 86 and the semiconductor substrate 2. The eighth electrode 82 is provided between the third solder portion 84 and the semiconductor substrate 2.

The first metal material, the second metal material or the third metal material is preferably Cu (copper), Ni (nickel), Al (aluminum), Ag (silver), Ti (titanium) or W (tungsten).

FIGS. 2 to 6 are schematic cross-sectional views showing a semiconductor device in the process of manufacturing in the method of manufacturing the main part of the semiconductor device 100 according to the present embodiment.

Figure 2:
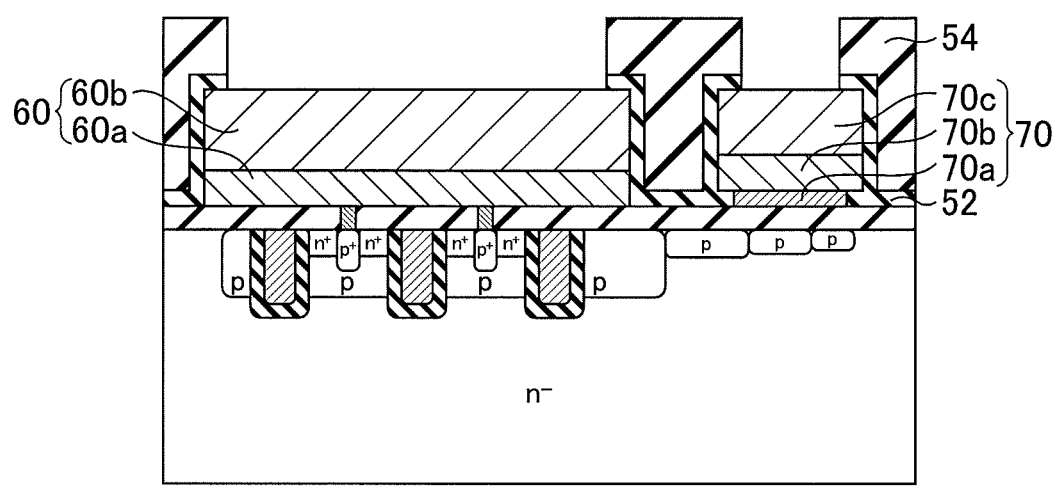
FIG. 2 is a schematic cross-sectional view showing the semiconductor device in the process of production in the method of producing the main part of the semiconductor device of the first embodiment.

For the semiconductor substrate 2 having the MOSFET 30 formed in and under the first region 40a of the first plane 2a, the first electrode 60 including the first Ti-containing electrode 60a and the first Al-containing electrode 60b is formed on the first region 40a. Further, the fourth electrode 70 including the polysilicon electrode 70a, the second Ti-containing electrode 70b, and the second Al-containing electrode 70c is formed on the second region 40b. Next, the insulation film 52 containing, for example, silicon oxide is formed on the first plane 2a, the first electrode 60, and the fourth electrode 70. Next, the insulation film 54 containing, for example, polyimide is formed on the insulation film 52. Next, the top of the first electrode 60 and the top of the fourth electrode 70 are exposed by photolithography (FIG. 2).

Figure 3:
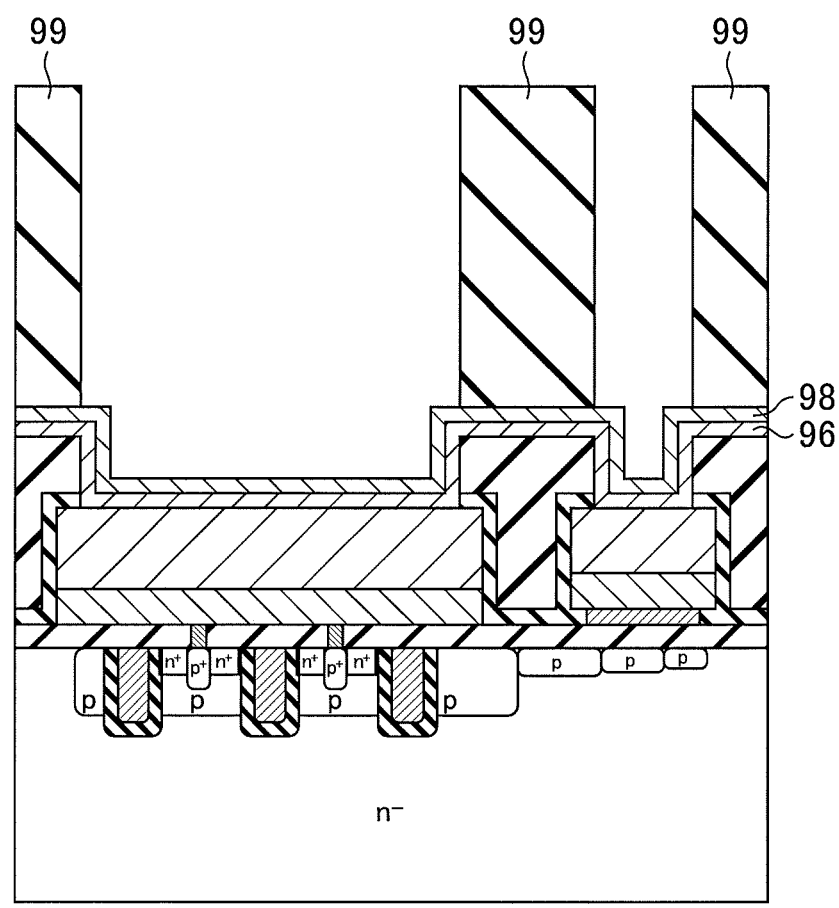
FIG. 3 is a schematic cross-sectional view showing the semiconductor device in the process of production in the method of producing the main part of the semiconductor device of the first embodiment.

Next, a film 96 containing, for example, Ti is formed on the insulation film 54, the exposed first electrode 60, and the exposed fourth electrode 70. Next, a film 98 containing Cu is formed on the film 96. Next, a photoresist 99 is formed on the film 98. Next, the photoresist 99 above the first electrode 60 and the fourth electrode 70 which was exposed in FIG. 2 are removed (FIG. 3).

Figure 4:
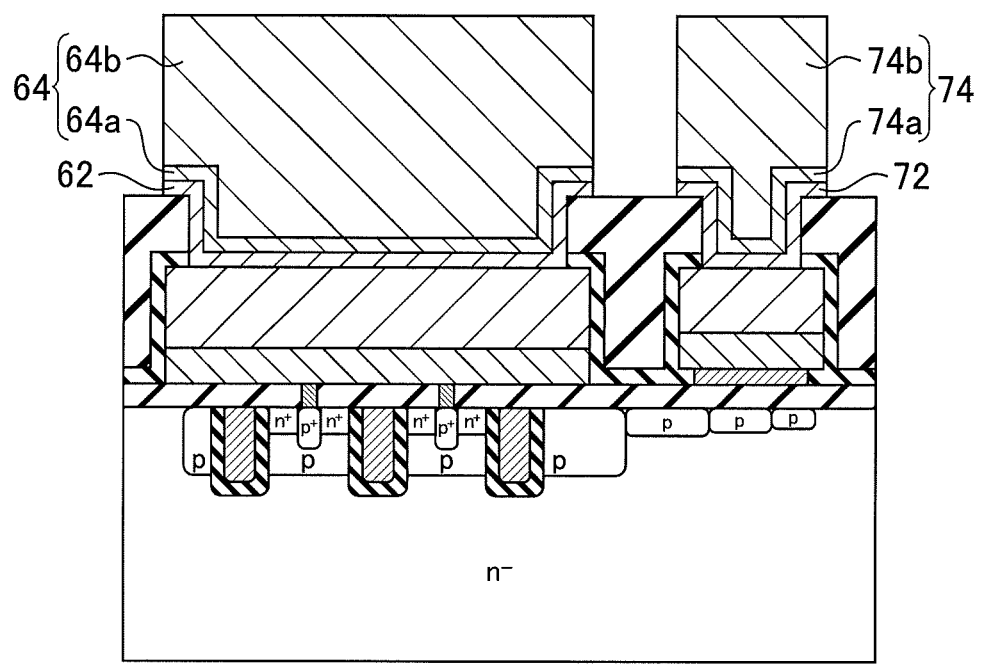
FIG. 4 is a schematic cross-sectional view showing the semiconductor device in process of manufacture in the method of manufacturing the main part of the semiconductor device of the first embodiment.

Next, the first plating electrode 64b is formed by, for example, plating above the first electrode 60 at the location from which the photoresist 99 is removed. Further, the second plating electrode 74b is formed, for example, by plating above the fourth electrode 70 at the location from which the photoresist 99 is removed. Next, the photoresist 99 is removed. Next, the film 96 and the film 98 at the location from which the photoresist 99 is removed are removed. The film 96 and the film 98 left between the first electrode 60 and the first plating electrode 64b are the first Ti-containing layer 62 and the first base layer 64a, respectively. Thereby, the second electrode 64 including the first base layer 64a and the first plating electrode 64b is formed. Further, the film 96 and the film 98 left between the fourth electrode 70 and the second plating electrode 74b are the second Ti-containing layer 72 and the second base layer 74a, respectively. Thus, the fifth electrode 74 including the second base layer 74a and the second plating electrode 74b is formed (FIG. 4).

Figure 5:
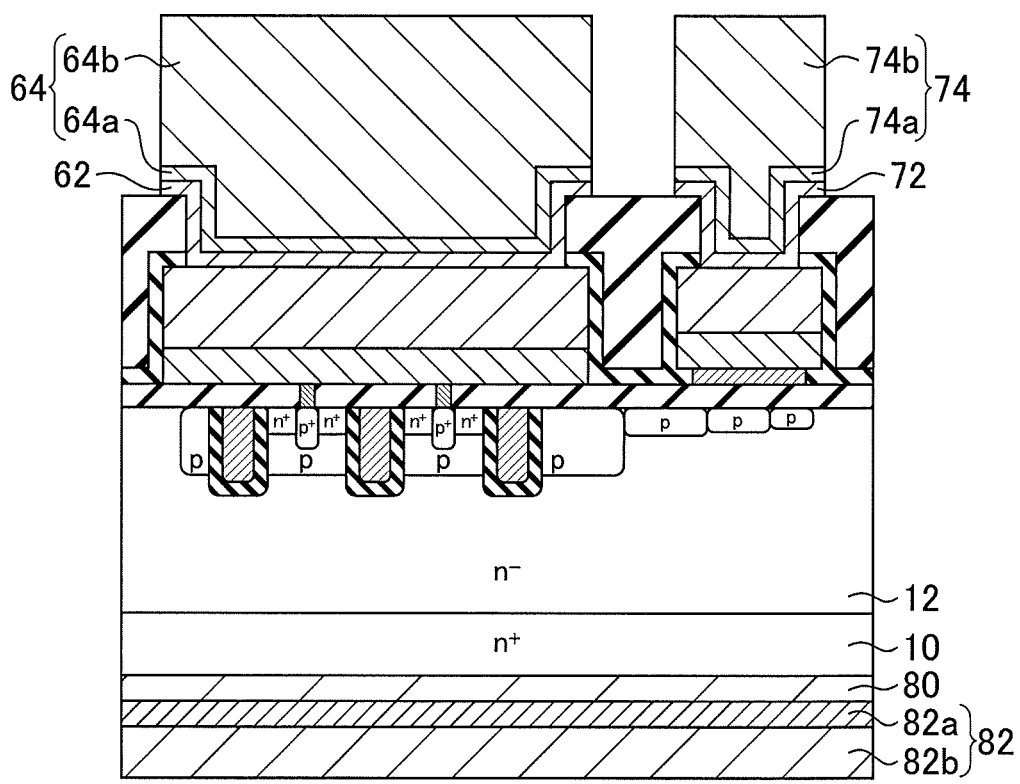
FIG. 5 is a schematic cross-sectional view showing the semiconductor device in the process of manufacture in the method of manufacturing the main part of the semiconductor device of the first embodiment.

Next, the plane of the semiconductor substrate 2 opposite to the first plane 2a is ground to thin the semiconductor substrate 2. The surface provided on the opposite side of the first plane 2a is the second plane 2b. Next, the semiconductor layer 10 is formed by performing ion implantation of, for example, n-type ions to the second plane 2b. Next, a barrier metal 80 containing TiW or TiN is formed on the second plane 2b, and the third base layer 82a in contact with the barrier metal 80 is formed. Next, the third plating electrode 82b in contact with the third base layer 82a is formed by, for example, plating. Thereby, the eighth electrode 82 including the third base layer 82a and the third plating electrode 82b is formed (FIG. 5).

Figure 6:
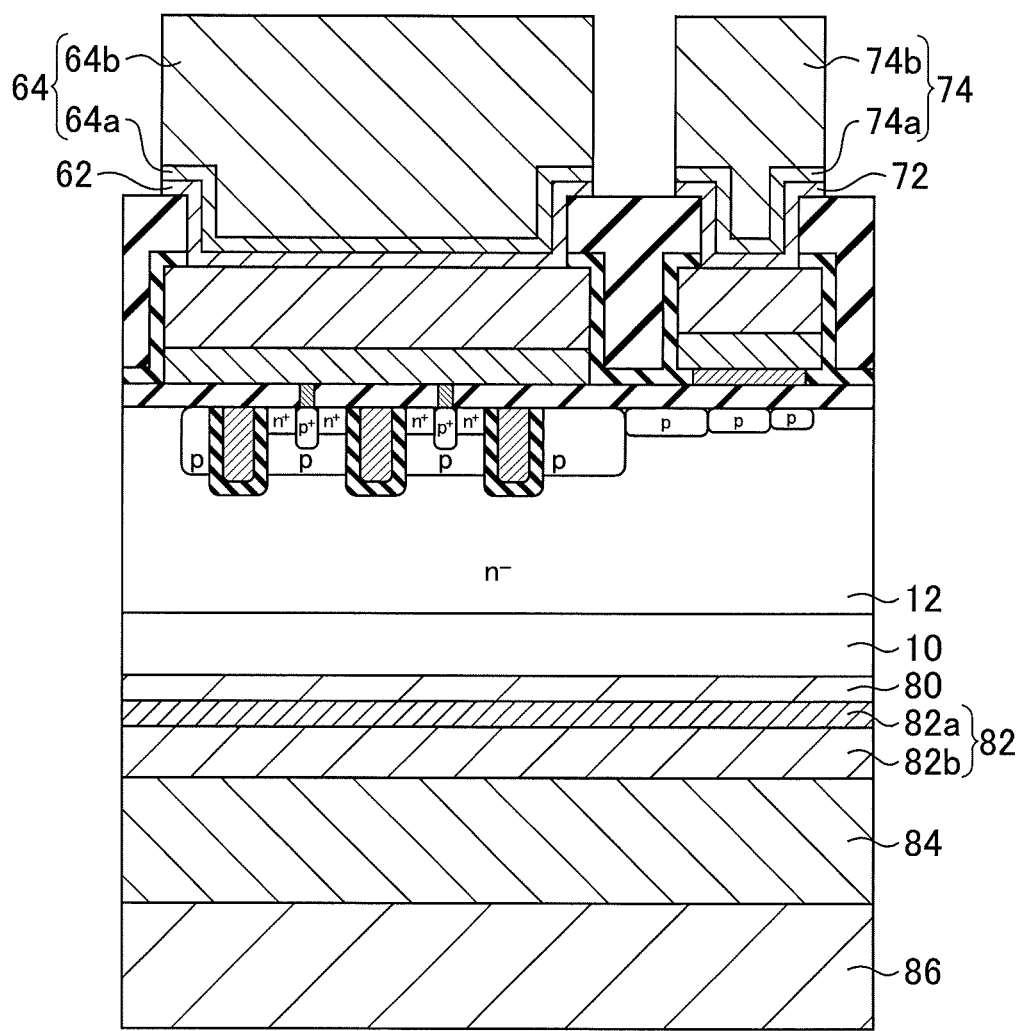
FIG. 6 is a schematic cross-sectional view showing the semiconductor device in the process of manufacture in the method of manufacturing the main part of the semiconductor device of the first embodiment.

Next, for example, cream solder is applied to the lower plane of the eighth electrode 82, and the seventh electrode 86 is brought into contact with the cream solder. Next, when the cream solder is heated and cooled, the cream solder is once melted and then cured, and the eighth electrode 82 and the seventh electrode 86 are joined by the third solder portion 84 (FIG. 6).

Next, for example, cream solder is applied to the second electrode 64 and the fifth electrode 74. Next, the third electrode 68 is brought into contact with the cream solder on the second electrode 64, and the sixth electrode 78 is brought into contact on the cream solder on the fifth electrode 74. Next, when the cream solder is heated and cooled, the cream solder is once melted and then cured. Thereby, the second electrode 64 and the third electrode 68 are joined by the first solder portion 66. Further, the fifth electrode 74 and the sixth electrode 78 are joined by the second solder portion 76. Thereby, the semiconductor device 100 of the present embodiment is obtained.

Next, the function and effect of the semiconductor device 100 of the present embodiment will be described.

The semiconductor device 100 includes the second electrode 64 including the first metal material, the second electrode 64 having a film thickness of $(65\ [\text{g}\cdot\mu\text{m}\cdot\text{cm}^{-3}])/$(density of the first metal material $[\text{g}\cdot\text{cm}^{-3}])$ or more, the fifth electrode 74 including the second metal material, the fifth electrode 74 having a film thickness of $(65\ [\text{g}\cdot\mu\text{m}\cdot\text{cm}^{-3}])/$(density of the second metal material $[\text{g}\cdot\text{cm}^{-3}])$, and the eighth electrode 82 including the third metal material, the eighth electrode 82 having a film thickness of $(65\ [\text{g}\cdot\mu\text{m}\cdot\text{cm}^{-3}])/$(density of the third metal material $[\text{g}\cdot\text{cm}^{-3}])$ or more.

For example, consider a semiconductor device in which the second electrode 64 is not provided. In this case, since the distance between the first solder portion 66 and the gate insulating film 16 is short, α rays generated from the first solder portion 66 penetrate the gate insulating film 16 and electron-positive hole pairs are easily generated. The positive holes remain in the gate insulating film 16 and the threshold voltage Vth of the MOSFET 30 changes to a more negative side.

Figure 7:
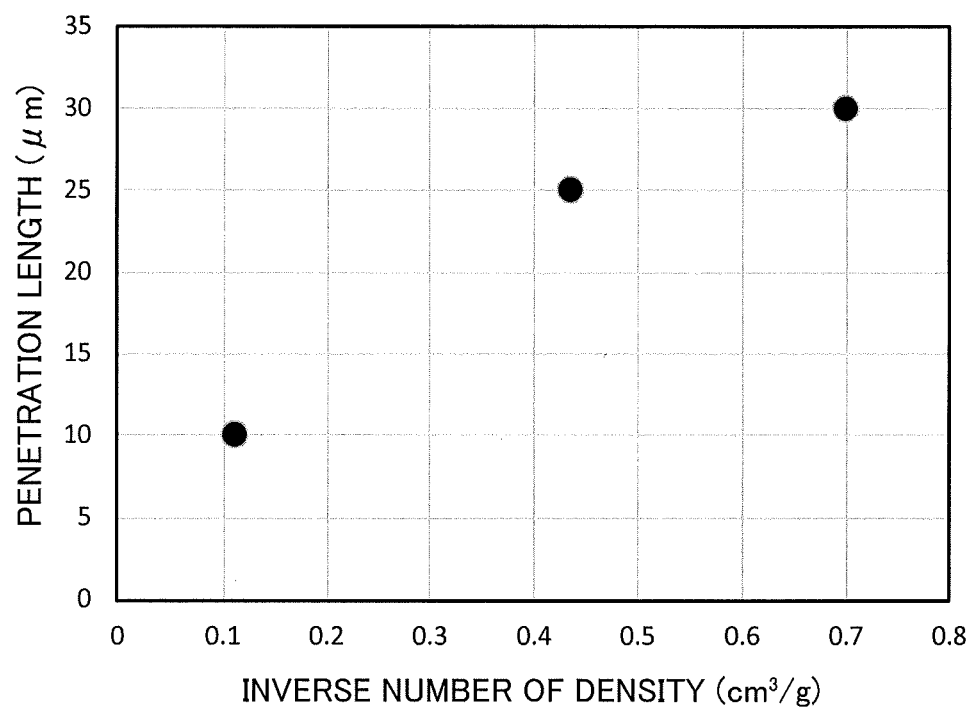
FIG. 7 is a diagram showing the relationship between the penetration length of a rays and the density of metal.

FIG. 7 is a diagram showing the relationship between the penetration length of α rays and the density of the material found by the present inventors. The inventors has studied the penetration length using the energy dependence of the force (LET: Linear Energy Transfer) that interacts with a substance. It has been found that the penetration length of α rays and the inverse number of the density of the material are in a proportional relationship. Furthermore, the present inventors have found that an electrode having a film thickness equal to or greater than the penetration length obtained from 1/(Stopping Power×Density), more specifically, an electrode having a film thickness of $(65\ [\text{g}\cdot\mu\text{m}\cdot\text{cm}^{-3}])/$(density of the metal material of the electrode $[\text{g}\cdot\text{cm}^{-3}])$ or more, is provided, so that the passage of α rays can be suppressed. This means that the higher the density of the metal material, the more easily the energy of α rays is absorbed in the electrode, so that the passage of α rays is suppressed.

Specifically, the second electrode 64 having a film thickness of $(65\ [\text{g}\cdot\mu\text{m}\cdot\text{cm}^{-3}])/$(density of the first metal material $[\text{g}\cdot\text{cm}^{-3}])$ or more is provided between the first solder portion 66 and the MOSFET 30, so that the penetration of α rays from the first solder portion 66 into the MOSFET 30 can be suppressed. This makes it possible to provide the semiconductor device 100 with high reliability.

Similarly, the fifth electrode 74 including the second metal material, the fifth electrode 74 having a film thickness of $(65\ [\text{g}\cdot\mu\text{m}\cdot\text{cm}^{-3}])/$(density of the second metal material $[\text{g}\cdot\text{cm}^{-3}])$ or more, is provided, so that the penetration of α rays from the second solder portion 76 into the MOSFET 30 can be suppressed. This makes it possible to provide the semiconductor device 100 with high reliability.

Similarly, the eighth electrode 82 including the third metal material, the eighth electrode 82 having a film thickness of $(65\ [\text{g}\cdot\mu\text{m}\cdot\text{cm}^{-3}])/$(density of the third metal material $[\text{g}\cdot\text{cm}^{-3}])$ or more, is provided, so that the penetration of α rays from the third solder portion 84 into the MOSFET 30 can be suppressed. This makes it possible to provide the semiconductor device 100 with high reliability.

For example, in the case of a stacked film of the first layer and the second layer, the preferred film thickness can be calculated by the sum of $(65\ [\text{g}\cdot\mu\text{m}\cdot\text{cm}^{-3}])/$(density of the first layer $[\text{g}\cdot\text{cm}^{-3}])$ and $(65\ [\text{g}\cdot\mu\text{m}\cdot\text{cm}^{-3}])/$(density of the second layer $[\text{g}\cdot\text{cm}^{-3}])$. The same applies to the case where the stacked film is composed of three or more layers.

A semiconductor device preferably includes the semiconductor substrate 2 having the first plane 2a and the second plane 2b, the semiconductor element 30 provided in the semiconductor substrate 2, the semiconductor element 30 including a gate insulating film 16 provided in the first plane 2a, the first electrode 60 provided on the first plane 2a, the first electrode 60 including a first metal material, the second electrode 64 provided on the first electrode 60, the second electrode 64 including a second metal material, the first solder portion 66 provided on the second electrode 64, the third electrode 68 provided on the first solder portion 66, the fourth electrode 70 provided on the first plane 2a, the fourth electrode 70 including a third metal material, the fifth electrode 74 provided on the fourth electrode 70, the fifth electrode 74 including a fourth metal material, the second solder portion 76 provided on the fifth electrode 74, and the sixth electrode 78 provided on the second solder portion 76, wherein a sum of a film thickness of the first electrode 60 and a film thickness of the second electrode 64 is equal to or more than $((65\ [\text{g}\cdot\mu\text{m}\cdot\text{cm}^{-3}])/$(density of the first metal material $[\text{g}\cdot\text{cm}^{-3}])+(65\ [\text{g}\cdot\mu\text{m}\cdot\text{cm}^{-3}]/$(density of the second metal material $[\text{g}\cdot\text{cm}^{-3}]))$, and wherein a sum of a film thickness of the fourth electrode and a film thickness of the fifth electrode is equal to or more than $((65\ [\text{g}\cdot\mu\text{m}\cdot\text{cm}^{-3}])/$(density of the third metal material $[\text{g}\cdot\text{cm}^{-3}])+(65\ [\text{g}\cdot\mu\text{m}\cdot\text{cm}^{-3}]/$(density of the fourth metal material $[\text{g}\cdot\text{cm}^{-3}]))$.

When the thickness of the semiconductor substrate 2 is 25 μm or less, it is particularly preferable that the eighth electrode 82 whose film thickness $t_3$ is $(65\ [\text{g}\cdot\mu\text{m}\cdot\text{cm}^{-3}])/$(density of the third metal material $[\text{g}\cdot\text{cm}^{-3}])$ or more be provided. This is because when the plate thickness of the semiconductor substrate 2 is 25 μm or less, α rays easily penetrate the MOSFET 30 from, in particular, the third solder portion 84. This relationship is applied when the semiconductor substrate 2 is an Si substrate, but it is not necessarily limited to the case where the semiconductor substrate 2 is an Si substrate. When the distance $d_1$ between the second plane 2b and the gate insulating film 16 is 25 μm or less, it is further preferable that the eighth electrode 82 whose film thickness $t_3$ is $(65\ [\text{g}\cdot\mu\text{m}\cdot\text{cm}^{-3}])/$(density of third metal material $[\text{g}\cdot\text{cm}^{-3}])$ or more be provided. This is because when the distance $d_1$ between the second plane 2b and the gate insulating film 16 is 25 μm or less, the amount of α rays penetrating the MOSFET 30 from, in particular, the third solder portion 84 increases.

Figure 8:
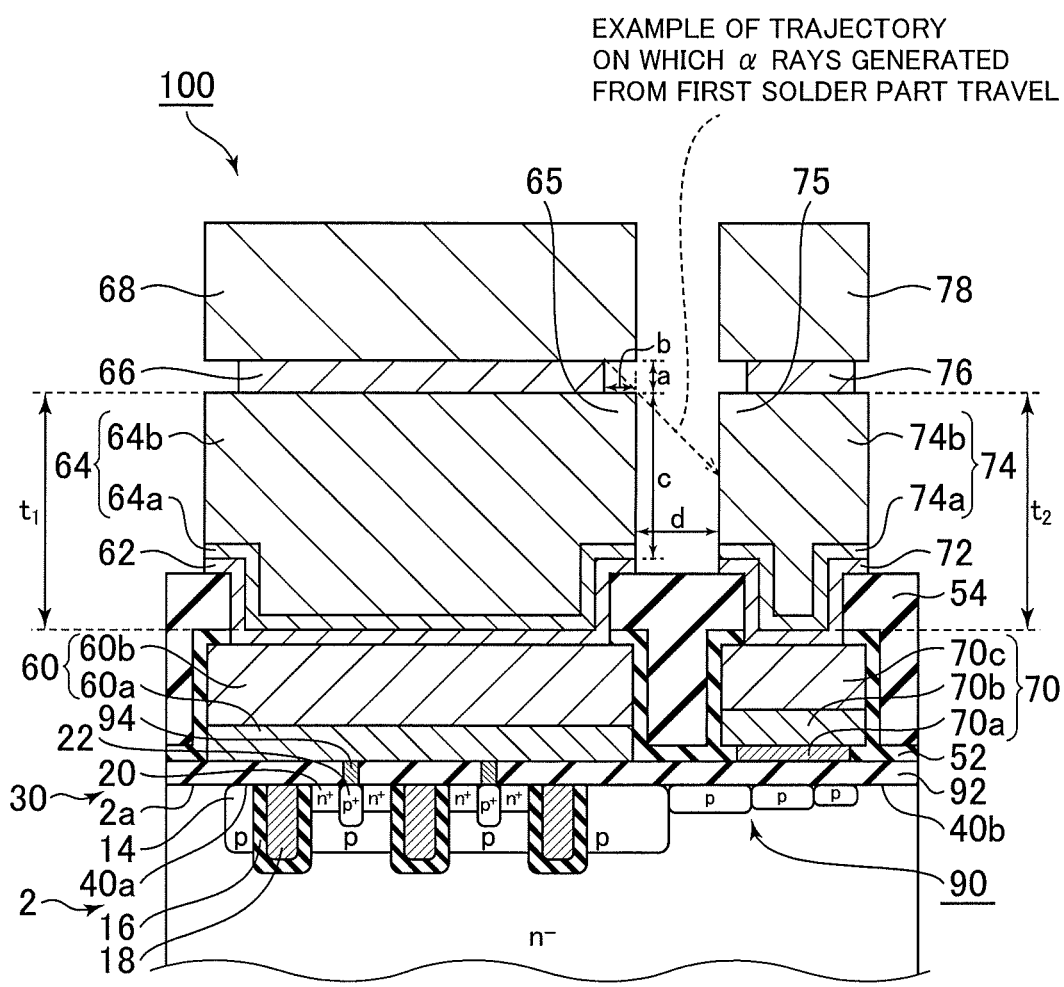
FIG. 8 is a diagram for explaining the function and effect of the semiconductor device of the first embodiment.

FIG. 8 is a view for explaining the function and effect of the semiconductor device 100 of the present embodiment, and is a diagram showing part of the upper portion of the semiconductor device 100. When $(a/b)<(a+c)/(b+d)$, where a is the film thickness of the first solder portion 66, b is the length of the upper face of the electrode portion 65 in the direction parallel to the first plane 2a, c is the film thickness of the electrode portion 65 in the direction perpendicular to the first plane 2a, and d is the distance between the electrode portion 65 and the fifth electrode 74 in the direction parallel to the first plane 2a, as shown by the dotted line in FIG. 7, α rays generated from a portion of the first solder portion 66 in the vicinity of the location where the first solder portion 66 and the third electrode 68 are in contact with each other collide with the fifth electrode 74 without penetrating the MOSFET 30, so that it is possible to suppress the penetration of α rays into the MOSFET 30. This makes it possible to provide the semiconductor device 100 with high reliability.

Similarly, when $(h/i)<(h+j)/(i+d)$, where h is a film thickness of the second solder portion 76, i is a length of an upper face of the electrode portion 75 in a direction parallel to the first plane 2a, j is a film thickness of the electrode portion 75 in a direction perpendicular to the first plane 2a, and d is a distance between the electrode portion 75 and the second electrode 64 in a direction parallel to the first plane 2a, α rays generated from a portion of the second solder portion 76 in the vicinity of the location where the second solder portion 76 and the sixth electrode 78 are in contact with each other collide with the second electrode 64 without penetrating the MOSFET, so that it is possible to suppress the penetration of α rays into the MOSFET 30. This makes it possible to provide the semiconductor device 100 with high reliability.

The first metal material, the second metal material, the third metal material or a fourth metal material is preferably Cu (copper), Ni (nickel), Al (aluminum), Ag (silver), Ti (titanium) or W (tungsten).

The description of the present embodiment is made for the semiconductor device including the trench MOSFET. Damage to the gate insulating film due to α rays is problematic for the trench semiconductor device, particular. However, it is a matter of course that the contents of the embodiment can be preferably implemented even for, for example, a planar MOSFET or a planar IGBT.

According to the semiconductor device 100 of the present embodiment, it is possible to provide the semiconductor device 100 with high reliability.

Second Embodiment

The semiconductor device of the present embodiment is different from the semiconductor device of the first embodiment in that the semiconductor substrate further includes a termination structure provided in a second region (a termination structure provided on the first plane adjacent to the semiconductor element, or a termination structure provided at the end of the semiconductor substrate). Further, the semiconductor device of the present embodiment satisfies $(a/b)>(a+e)/f$, where e is a distance between the first solder portion and the semiconductor substrate, and f is a distance between a first portion obtained by projecting the first solder portion on the first plane and the termination structure.

Further, the semiconductor device of the present embodiment is different from the semiconductor device of the first embodiment in that the semiconductor substrate further includes a third region provided in the second region (the first plane adjacent to the semiconductor element), the third region being not provided with the gate insulating film. Further, the semiconductor device of the present embodiment is different from the semiconductor device of the first embodiment in that $(a/b)>(a+e)/g$, where e is a distance between the first solder portion and the semiconductor substrate, and g is a distance between the first portion obtained by projecting the first solder portion on the first plane and the third region.

Here, the description of the second embodiment overlapping that of the first embodiment will be omitted.

Figure 9:
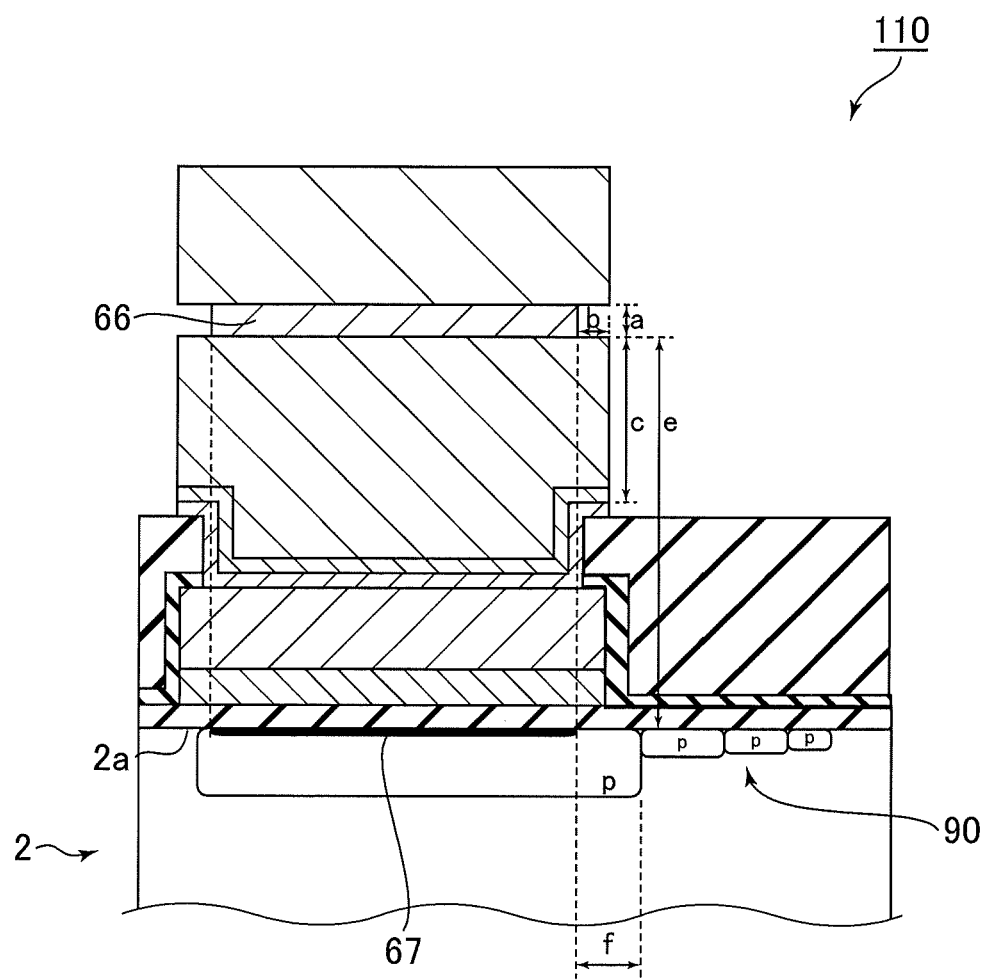
FIG. 9 is a schematic cross-sectional view of a semiconductor device of a second embodiment.

FIG. 9 is a schematic cross-sectional view of the main part of a semiconductor device 110 of the present embodiment. It is preferable that $(a/b)>(a+e)/f$, where e is a distance between the first solder portion 66 and the semiconductor substrate 2, and f is a distance between a first portion 67 obtained by projecting the first solder portion 66 on the first plane 2a and the termination structure 90. This is because since the termination structure 90 is not provided with the gate insulating film, the problem that the threshold voltage Vth of the MOSFET changes to a more negative side due to the positive holes remaining in insulation film does not occur.

Figure 10:
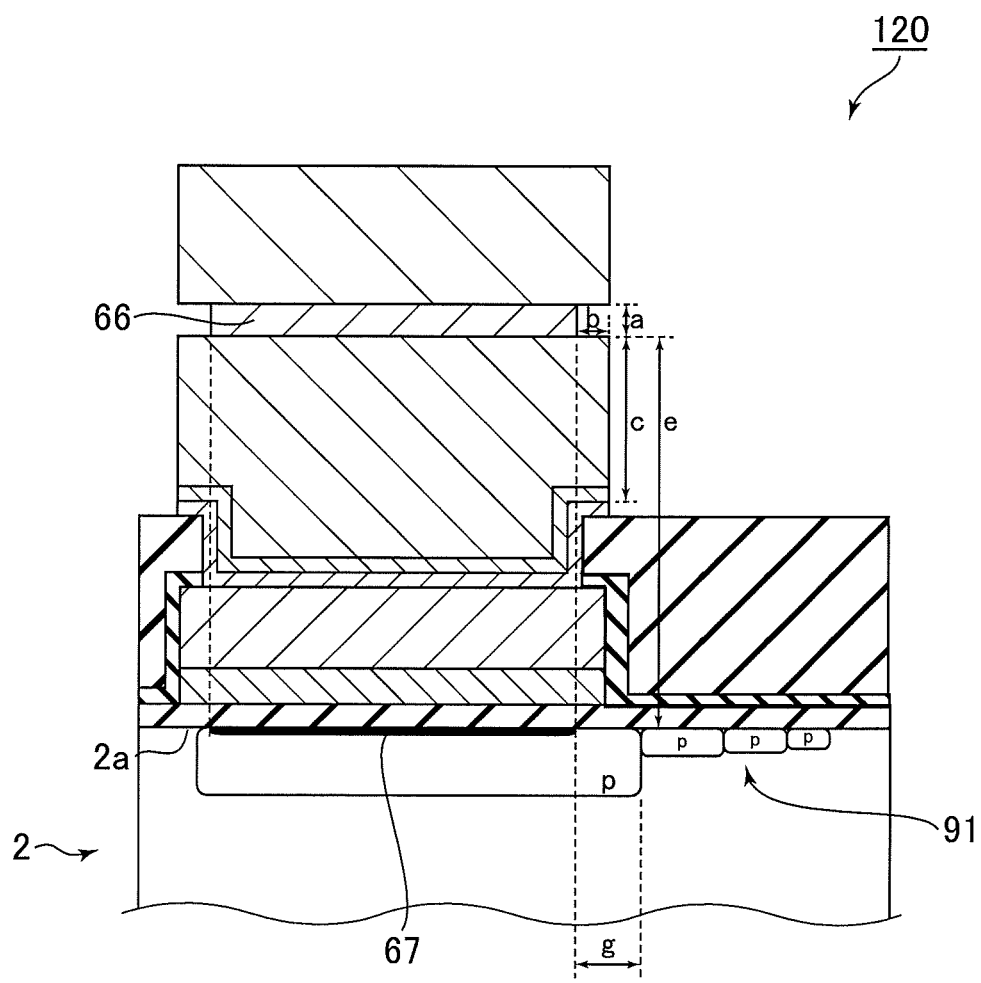
FIG. 10 is a schematic cross-sectional view of a semiconductor device of another aspect of the second embodiment.

FIG. 10 is a schematic cross-sectional view of a semiconductor device 120 according to another aspect of the present embodiment. A third region 91 is a region where the gate insulating film is not provided and is, for example, a termination structure, but it is not specific to this. It is preferable that $(a/b)>(a+e)/g$, where g is a distance between the first portion 67 obtained by projecting the first solder portion 66 on the first plane 2a and the third region 91.

According to the semiconductor devices 110 and 120 of the present embodiment, it is possible to provide the semiconductor device 100 with high reliability.

Third Embodiment

The semiconductor device of the present embodiment is different from those of the first embodiment and the second embodiment in that the second portion obtained by projecting the second electrode on the first plane 2a and the third portion obtained by projecting the fourth electrode on the first plane are in contact with each other or overlap each other. Here, the description of the third embodiment overlapping those of the first embodiment and the second embodiment will be omitted.

Figure 11:
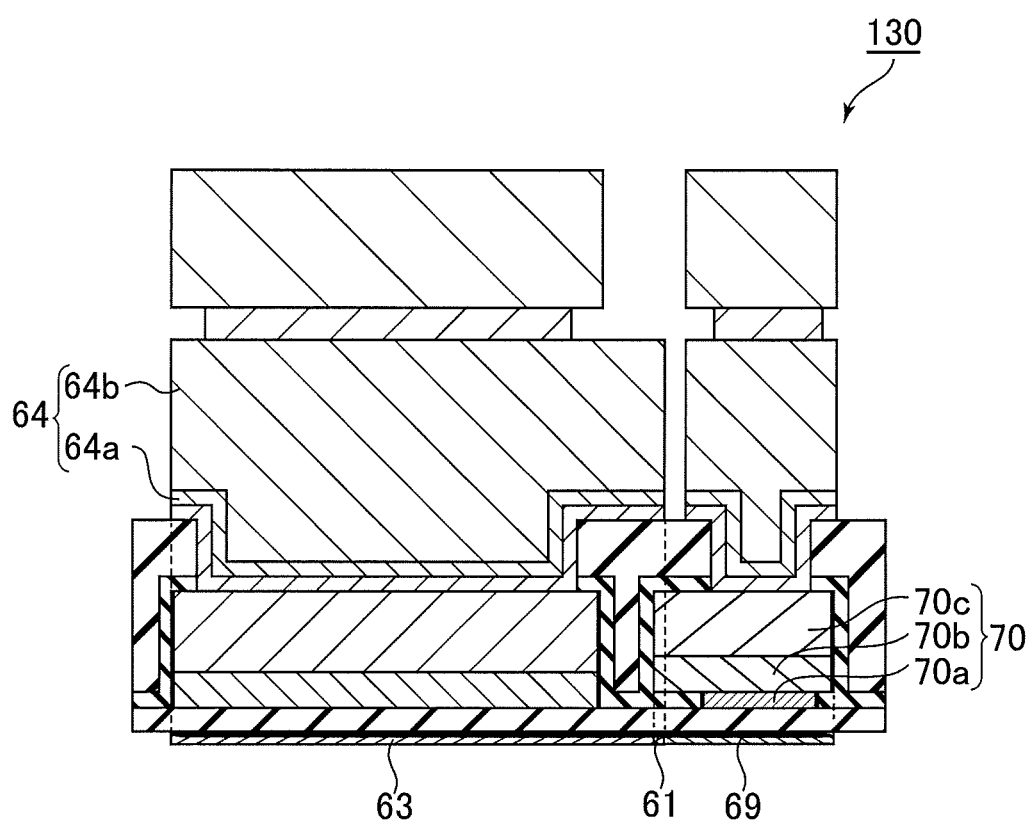
FIG. 11 is a schematic cross-sectional view of a semiconductor device of a third embodiment.

FIG. 11 is a schematic cross-sectional view of the main part of a semiconductor device 130 of this embodiment. A second portion 63 obtained by projecting the second electrode 64 on the first plane 2a and a third portion 69 obtained by projecting the fourth electrode 70 on the first plane 2a have an overlapping portion 61. The second portion 63 and the third portion 69 may be in contact with each other.

The semiconductor device 130 generates heat due to the driving of the MOSFET 30. At this time, there is a problem that the insulation film 52 and the insulation film 54 between the first electrode 60 and the fourth electrode 70 are broken due to heat generation where no electrode is provided on the insulation film 52 and the insulation film 54.

According to the semiconductor device 130 of the present embodiment, the second portion 63 obtained by projecting the second electrode 64 on the first plane 2a and the third portion 69 obtained by projecting the fourth electrode 70 on the first plane 2a are in contact with each other, or overlap each other. Therefore, the heat of the insulation film 52 and the insulation film 54 between the first electrode 60 and the fourth electrode 70 is easily absorbed by the second electrode 64 and the fourth electrode 70. Therefore, destruction due to heat generation can be suppressed.

Note that the semiconductor device 130 is preferably used even when a portion obtained by projecting the fifth electrode 74 on the first plane 2a and a portion obtained by projecting the first electrode 60 on the first plane 2a are in contact with each other, or overlap each other.

According to the semiconductor device 130 of the present embodiment, it is possible to provide a semiconductor device configured to suppress destruction due to heat generation.

While certain embodiments have been described, these embodiments have been presented by way of example only, and are not intended to limit the scope of the inventions. Indeed, a semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate having a first plane and a second plane;
   a semiconductor element provided in the semiconductor substrate, the semiconductor element including a gate insulating film provided in the first plane;
   a first electrode provided on the first plane;
   a second electrode provided on the first electrode, the second electrode including a first metal material, the second electrode having a film thickness of (65 [g·μm·cm$^{-3}$])/(density of the first metal material [g·cm$^{-3}$]) or more;
   a first solder portion provided on the second electrode;
   a third electrode provided on the first solder portion;
   a fourth electrode provided on the first plane;
   a fifth electrode provided on the fourth electrode, the fifth electrode including a second metal material, the fifth electrode having a film thickness of (65 [g·μm·cm$^{-3}$])/(density of the second metal material [g·cm$^{-3}$]) or more;
   a second solder portion provided on the fifth electrode; and
   a sixth electrode provided on the second solder portion.

2. The semiconductor device according to claim 1,
   wherein the second electrode includes, between the second electrode and the fifth electrode, a first electrode portion protruding in parallel to the first plane relative to the first solder portion, and
   wherein (a/b)<(a+c)/(b+d), where a is a film thickness of the first solder portion, b is a length of an upper face of the first electrode portion in a direction parallel to the first plane, c is a film thickness of the first electrode portion in a direction perpendicular to the first plane, and d is a distance between the first electrode portion and the fifth electrode in a direction parallel to the first plane.

3. The semiconductor device according to claim 1, further comprising:
   a seventh electrode provided under the second plane of the semiconductor substrate;
   a third solder portion provided between the seventh electrode and the semiconductor substrate;
   an eighth electrode provided between the third solder portion and the semiconductor substrate, the eighth electrode including a third metal material, the eighth electrode having a film thickness of (65 [g·μm·cm$^{-3}$])/(density of the third metal material [g·cm$^{-3}$]) or more,
   wherein the semiconductor substrate has a thickness of 25 μm or less.

4. The semiconductor device according to claim 1,
   wherein the semiconductor substrate further includes a termination structure provided at an end of the semiconductor substrate, and
   wherein (a/b)>(a+e)/f, where a is a film thickness of the first solder portion, b is a length of an upper face of the first electrode portion in a direction parallel to the first plane, e is a distance between the first solder portion and the semiconductor substrate, and f is a distance between a first portion obtained by projecting the first solder portion on the first plane and the termination structure.

5. The semiconductor device according to claim 1,
   wherein the second electrode or the fifth electrode includes a stacked structure of a plurality of metal layers.

6. The semiconductor device according to claim 1,
   wherein a second portion obtained by projecting the second electrode on the first plane and a third portion obtained by projecting the fourth electrode on the first plane are in contact with each other or overlap each other.

7. The semiconductor device according to claim 1,
   wherein the gate insulating film extends from the first plane to the second plane of the semiconductor substrate.

8. The semiconductor device according to claim 1,
   wherein the first metal material and the second metal material are Cu (copper), Ni (nickel), Al (aluminum), Ag (silver), Ti (titanium) or W (tungsten).

9. The semiconductor device according to claim 1,
   wherein the fifth electrode includes, between the second electrode and the fifth electrode, a second electrode portion protruding in parallel to the first plane relative to the second solder portion, and
   wherein (h/i)<(h+j)/(i+d), where h is a film thickness of the second solder portion, i is a length of an upper face of the second electrode portion in a direction parallel to the first plane, j is a film thickness of the second electrode portion in a direction perpendicular to the first plane, and d is a distance between the second electrode portion and the second electrode in a direction parallel to the first plane.

10. A semiconductor device comprising:
    a semiconductor substrate having a first plane and a second plane;
    a semiconductor element provided in the semiconductor substrate, the semiconductor element including a gate insulating film provided in the first plane;
    a first electrode provided on the first plane, the first electrode including a first metal material;
    a second electrode provided on the first electrode, the second electrode including a second metal material;
    a first solder portion provided on the second electrode;
    a third electrode provided on the first solder portion;
    a fourth electrode provided on the first plane, the fourth electrode including a third metal material;
    a fifth electrode provided on the fourth electrode, the fifth electrode including a fourth metal material;
    a second solder portion provided on the fifth electrode; and
    a sixth electrode provided on the second solder portion,
    wherein a sum of a film thickness of the first electrode and a film thickness of the second electrode is equal to or more than ((65 [g·μm·cm$^{-3}$])/(density of the first metal material [g·cm$^{-3}$])+(65 [g·μm·cm$^{-3}$]/(density of the second metal material [g·cm$^{-3}$])), and wherein a sum of a film thickness of the fourth electrode and a film thickness of the fifth electrode is equal to or more than ((65 [g·μm·cm$^{-3}$])/(density of the third metal material [g·cm$^{-3}$])+(65[g·μm·cm$^{-3}$]/(density of the fourth metal material [g·cm$^{-3}$])).

11. The semiconductor device according to claim 10, wherein the second electrode includes, between the second electrode and the fifth electrode, a first electrode portion protruding in parallel to the first plane relative to the first solder portion, and wherein (a/b)<(a+c)/(b+d), where a is a film thickness of the first solder portion, b is a length of an upper face of the first electrode portion in a direction parallel to the first plane, c is a film thickness of the first electrode portion in a direction perpendicular to the first plane, and d is a distance between the first electrode portion and the fifth electrode in a direction parallel to the first plane.

12. The semiconductor device according to claim 10, further comprising:

a seventh electrode provided under the second plane of the semiconductor substrate;

a third solder portion provided between the seventh electrode and the semiconductor substrate; and an eighth electrode provided between the third solder portion and the semiconductor substrate, the eighth electrode including a third metal material, the eighth electrode having a film thickness of (65 [g·μm·cm$^{-3}$])/(density of the third metal material [g·cm$^{-3}$]) or more, wherein the semiconductor substrate has a thickness of 25 μm or less.

13. The semiconductor device according to claim 10, wherein the semiconductor substrate further includes a termination structure provided at an end of the semiconductor substrate, and wherein (a/b)>(a+e)/f, where a is a film thickness of the first solder portion, b is a length of an upper face of the first electrode portion in a direction parallel to the first plane, e is a distance between the first solder portion and the semiconductor substrate, and f is a distance between a first portion obtained by projecting the first solder portion on the first plane and the termination structure.

14. The semiconductor device according to claim 10, wherein the second electrode or the fifth electrode includes a stacked structure of a plurality of metal layers.

15. The semiconductor device according to claim 10, wherein a second portion obtained by projecting the second electrode on the first plane and a third portion obtained by projecting the fourth electrode on the first plane are in contact with each other or overlap each other.

16. The semiconductor device according to claim 10, wherein the gate insulating film extends from the first plane to the second plane of the semiconductor substrate.

17. The semiconductor device according to claim 10, wherein the first metal material, the second metal material, the third metal material, and the fourth metal material are Cu (copper), Ni (nickel), Al (aluminum), Ag (silver), Ti (titanium), or W (tungsten).

18. The semiconductor device according to claim 10, wherein the fifth electrode includes, between the second electrode and the fifth electrode, a second electrode portion protruding in parallel to the first plane relative to the second solder portion, and wherein (h/i)<(h+j)/(i+d), where his a film thickness of the second solder portion, i is a length of an upper face of the second electrode portion in a direction parallel to the first plane, j is a film thickness of the second electrode portion in a direction perpendicular to the first plane, and d is a distance between the second electrode portion and the second electrode in a direction parallel to the first plane.

* * * * *